US012680663B2

(12) United States Patent
Chen et al.

(10) Patent No.: US 12,680,663 B2
(45) Date of Patent: Jul. 14, 2026

(54) ELECTRONIC DEVICE

(71) Applicant: InnoLux Corporation, Miao-Li County (TW)

(72) Inventors: Yen-Liang Chen, Miao-Li County (TW); Chao-Chun Huang, Miao-Li County (TW); Ming-Hui Chu, Miao-Li County (TW); Yu-Hsuan Hsiao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 546 days.

(21) Appl. No.: 18/298,418

(22) Filed: Apr. 11, 2023

(65) Prior Publication Data

US 2023/0369298 A1 Nov. 16, 2023

(30) Foreign Application Priority Data

May 13, 2022 (CN) .......................... 202210524924.6

(51) Int. Cl.
*F21S 43/249* (2018.01)
*F21S 43/20* (2018.01)
(Continued)

(52) U.S. Cl.
CPC ....... *F21S 43/249* (2018.01); *F21S 43/26241* (2024.05); *G02B 6/0058* (2013.01); *H10W 90/00* (2026.01)

(58) Field of Classification Search
CPC .................................................... H10H 29/855
See application file for complete search history.

(56) References Cited

U.S. PATENT DOCUMENTS

| | | | |
|---|---|---|---|
| 7,661,835 B2 | 2/2010 | Chou et al. | |
| 2012/0104367 A1 | 5/2012 | Hasegawa | |
| 2022/0158135 A1* | 5/2022 | Irobe .................... | H10H 20/855 |

FOREIGN PATENT DOCUMENTS

| | | |
|---|---|---|
| CN | 103104858 A | 5/2013 |
| CN | 113192942 A | 7/2021 |

(Continued)

OTHER PUBLICATIONS

Chinese language office action dated Oct. 3, 2025, issued in application No. TW 111147179.

(Continued)

*Primary Examiner* — Feifei Yeung Lopez
(74) *Attorney, Agent, or Firm* — McClure, Qualey & Rodack, LLP

(57) ABSTRACT

An electronic device is provided. The electronic device includes a substrate and a plurality of light-emitting assemblies. The substrate includes a first edge, an edge region, and a central region. The edge region is adjacent to the first edge. The central region is adjacent to the edge region and away from the first edge. The light-emitting assemblies are disposed on the substrate, and each of the light-emitting assemblies has a tuning element and a light-emitting element. The light-emitting assemblies further include a first light-emitting assembly and a second light-emitting assembly. The first light-emitting assembly is disposed in the central region and has a first light-emitting pattern. The second light-emitting assembly is disposed in the edge region and has a second light-emitting pattern. At a viewing angle of 60°, the brightness of the first light-emitting pattern is higher than the brightness of the second light-emitting pattern.

18 Claims, 7 Drawing Sheets

(51) Int. Cl.
   *F21V 8/00*            (2006.01)
   *H10W 90/00*           (2026.01)

(56)                References Cited

FOREIGN PATENT DOCUMENTS

| TW | 200601585 A | 1/2006 |
| TW | 200700837 A | 1/2007 |

OTHER PUBLICATIONS

Chinese language office action dated Mar. 19, 2026, issued in application No. CN 202210524924.6.

* cited by examiner

ELECTRONIC DEVICE

CROSS REFERENCE TO RELATED APPLICATIONS

This Application claims priority of China Patent Application No. 202210524924.6, filed on May 13, 2022, the entirety of which is incorporated by reference herein.

BACKGROUND

Field of the Invention

The present invention relates to an electronic device, and, in particular, to an electronic device having multiple light-emitting assemblies with different light-emitting patterns.

Description of the Related Art

Thanks to technological developments, the use of electronic devices is very common nowadays. In particular, electronic devices with display functions have become an indispensable part of daily life. These electronic devices may include light-emitting elements that are disposed under a display panel. However, due to the physical characteristics of the light-emitting elements, the brightness is likely to be uneven at the edges of the display panel, which makes for a negative user experience. Therefore, with current electronic devices, there is still room for improvement.

BRIEF SUMMARY

An embodiment of the present invention provides an electronic device, which includes a substrate and a plurality of light-emitting assemblies. The substrate includes a first edge, an edge region, and a central region. The edge region is adjacent to the first edge. The central region is adjacent to the edge region and away from the first edge. The light-emitting assemblies are disposed on the substrate, and each of the light-emitting assemblies has a tuning element and a light-emitting element. The light-emitting assemblies further include a first light-emitting assembly and a second light-emitting assembly. The first light-emitting assembly is disposed in the central region and has a first light-emitting pattern. The second light-emitting assembly is disposed in the edge region and has a second light-emitting pattern. At a viewing angle of 60°, the brightness of the first light-emitting pattern is higher than the brightness of the second light-emitting pattern.

BRIEF DESCRIPTION OF THE DRAWINGS

The present invention can be more fully understood by reading the subsequent detailed description and examples with references made to the accompanying drawings, wherein.

DETAILED DESCRIPTION

Figure 1:
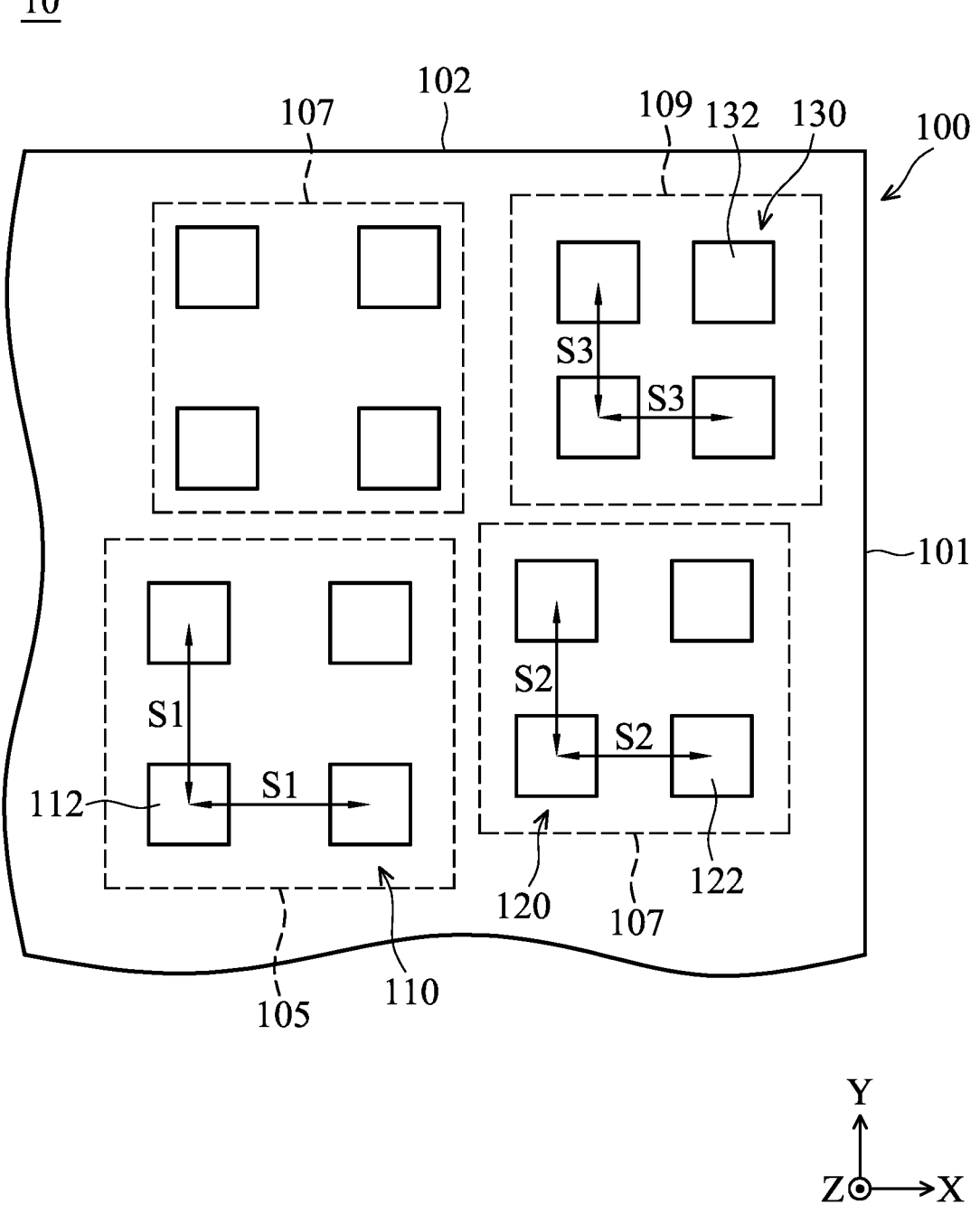
FIG. 1 shows a partial plan view of an electronic device in accordance with some embodiments of the present disclosure.

The present disclosure may be understood by referring to the following description and the appended drawings. It should be noted that, in order to make the reader easy to understand and make the drawings concise, the drawings in the present disclosure may illustrate a part of the light-emitting unit, and specific elements in the drawings are not drawn based on the actual scale. In addition, the number and the size of each component in the drawings merely serves as an example, and are not intended to limit the scope of the present disclosure. Furthermore, similar and/or corresponding numerals may be used in different embodiments for describing some embodiments simply and clearly, but not represent any relationship between different embodiment and/or structures discussed below.

Certain terms may be used throughout the present disclosure and the appended claims to refer to particular elements. Those skilled in the art will understand that electronic device manufacturers may refer to the same components by different names. The present specification is not intended to distinguish between components that have the same function but different names. In the following specification and claims, the words "including", "comprising", "having" and the like are open words, so they should be interpreted as meaning "including but not limited to . . . ". Therefore, when terms "including", "comprising", and/or "having" are used in the description of the disclosure, the presence of corresponding features, regions, steps, operations and/or components is specified without excluding the presence of one or more other features, regions, steps, operations and/or components.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

When a corresponding component (such as a film layer or region) is referred to as "on another component", it may be directly on another component, or there may be other components in between. On the other hand, when a component is referred "directly on another component", there is no component between the former two. In addition, when a component is referred "on another component", the two components have an up-down relationship in the top view, and this component can be above or below the other component, and this up-down relationship depends on the orientation of the device.

It should be understood that, although the terms "first", "second" etc. may be used herein to describe various elements, layers and/or portions, and these elements, layers, and/or portions should not be limited by these terms. These terms are only used to distinguish one element, layer, or portion. Thus, a first element, layer or portion discussed below could be termed a second element, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

In the present disclosure, the thickness, length, and width can be measured by using an optical microscope, and the thickness can be measured by the cross-sectional image in the electron microscope, but it is not limited thereto. In addition, a certain error may be present in a comparison with any two values or directions. The terms "about," "equal to," "equivalent," "the same," "essentially" or "substantially" are generally interpreted as within 20% of a given value or range, or as interpreted as within 10%, 5%, 3%, 2%, 1%, or 0.5% of a given value or range.

It should be noted that the technical solutions provided by different embodiments below may be interchangeable, combined or mixed to form another embodiment without departing from the spirit of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

FIG. 1 shows a partial plan view of an electronic device 10 in accordance with some embodiments of the present disclosure. The electronic device 10 may include a display device, a backlight device, an antenna device, a sensing device or a splicing device, but the present disclosure is not limited thereto. The electronic device 10 may be a bendable or flexible electronic device. The display device may be a non-self-luminous display device or a self-luminous display device. The antenna device may be a liquid-crystal type antenna device or a non-liquid-crystal type antenna device. The sensing device may be a sensing device for sensing capacitance, light, thermal energy or ultrasonic waves, but the present disclosure is not limited thereto. In some embodiments, the electronic device 10 includes a flexible panel, and the flexible panel includes electronic components, which may include passive components and active components, such as capacitors, resistors, inductors, diodes, transistors, and the like. In some embodiments, the diodes may include light-emitting diodes or photodiodes. The light-emitting diodes may, for example, include organic light-emitting diodes (OLEDs), mini LEDs, micro LEDs or quantum dot LEDs, but the present disclosure is not limited thereto. The splicing device may be, for example, a display splicing device or an antenna splicing device, but the present disclosure is not limited thereto. It should be noted that the electronic device 10 may be any combination of the above-mentioned devices, but the present disclosure is not limited thereto. It should be understood that the content of the present disclosure will be discussed with respect to the partial structure of the electronic device 10 in the following paragraphs, and those skilled in the art should understand that the electronic device 10 may also include other structures to perform expected functions.

As shown in FIG. 1, the electronic device 10 may include a substrate 100. The substrate 100 may include a first edge 101 and a second edge 102 that are substantially perpendicular to each other, and the first edge 101 and the second edge 102 intersect, forming a corner. In some embodiments, the substrate 100 may include a central region 105, an edge region 107, and a corner region 109, wherein the edge region 107 is adjacent to the first edge 101 or the second edge 102. The central region 105 is adjacent to the edge region 107 and away from the first edge 101 and the second edge 102. The corner region 109 is adjacent to the first edge 101 and the second edge 102, and therefore is located at the corner where the first edge 101 and the second edge 102 are intersected. It should be understood that merely a part of the substrate 100 is shown in this embodiment, but it is not indicated that the rest of the substrate 100 will also include the same configuration as the shown embodiment.

In some embodiments, a first light-emitting assembly 110, a second light-emitting assembly 120 and a third light-emitting assembly 130 are disposed on the substrate 100, wherein the first light-emitting assembly 110 is disposed in the central region 105, and the second light-emitting assembly 120 is disposed in the edge region 107, and the third light-emitting assembly 130 is disposed in the corner region 109. The first light-emitting assembly 110 may include a plurality of light-emitting elements 112, the second light-emitting assembly 120 may include a plurality of light-emitting elements 122, and the third light-emitting assembly 130 may include a plurality of light-emitting elements 132. In some embodiments, the distance S1 between the adjacent light-emitting elements 112 may be greater than the distance S2 between the adjacent light-emitting elements 122, and the distance S2 between the adjacent light-emitting elements 122 may be greater than the distance S3 between the adjacent light-emitting elements 132 (for example, the distance S1>the distance S2>the distance S3). In some embodiments, the distance S1 may be the distance between the center points of the adjacent light-emitting elements 112 in a direction (such as the X axis or the Y axis) parallel to the first edge 101 or the second edge 102. Similarly, the distance S2 and the distance S3 can also be measured in the same manner as the distance S1. In some embodiments, the distance S3 may be greater than or equal to about a quarter of the distance S1 (for example, the distance S3≥¼ of the distance S1), but the present disclosure is not limited thereto.

By increasing the density of the light-emitting elements 122 in the edge region 107 and the density of the light-emitting elements 132 in the corner region 109 (that is, reducing the distance between adjacent light-emitting elements), the brightness difference among the central region 105, the edge region 107, and the corner region 109 may be reduced, improving the display uniformity of the electronic device 10. In addition, although the distance of the adjacent light-emitting elements 112 is the same in the X axis and the Y axis in this embodiment (so as the adjacent light-emitting elements 122 and the adjacent light-emitting elements 132), it is also possible to make the distance between the adjacent light-emitting elements 112 vary in the X axis and the Y axis, respectively (so as the adjacent light-emitting elements 122 and the adjacent light-emitting elements 132).

In addition, it should be noted that although four light-emitting elements are shown in the first light-emitting assembly 110, the second light-emitting assembly 120, and the third light-emitting assembly 130 in this embodiment, they simply serve as an illustrative example to describe the positional relationship between the light-emitting elements, but not intended to limit the scope of the present disclosure.

In other words, the first light-emitting assembly 110, the second light-emitting assembly 120, and the third light-emitting assembly 130 can respectively include any number of light-emitting elements, and the number of light-emitting elements of the first light-emitting assembly 110, the second light-emitting assembly 120, and the third light-emitting assembly 130 may be the same as or different from each other.

Figure 2:
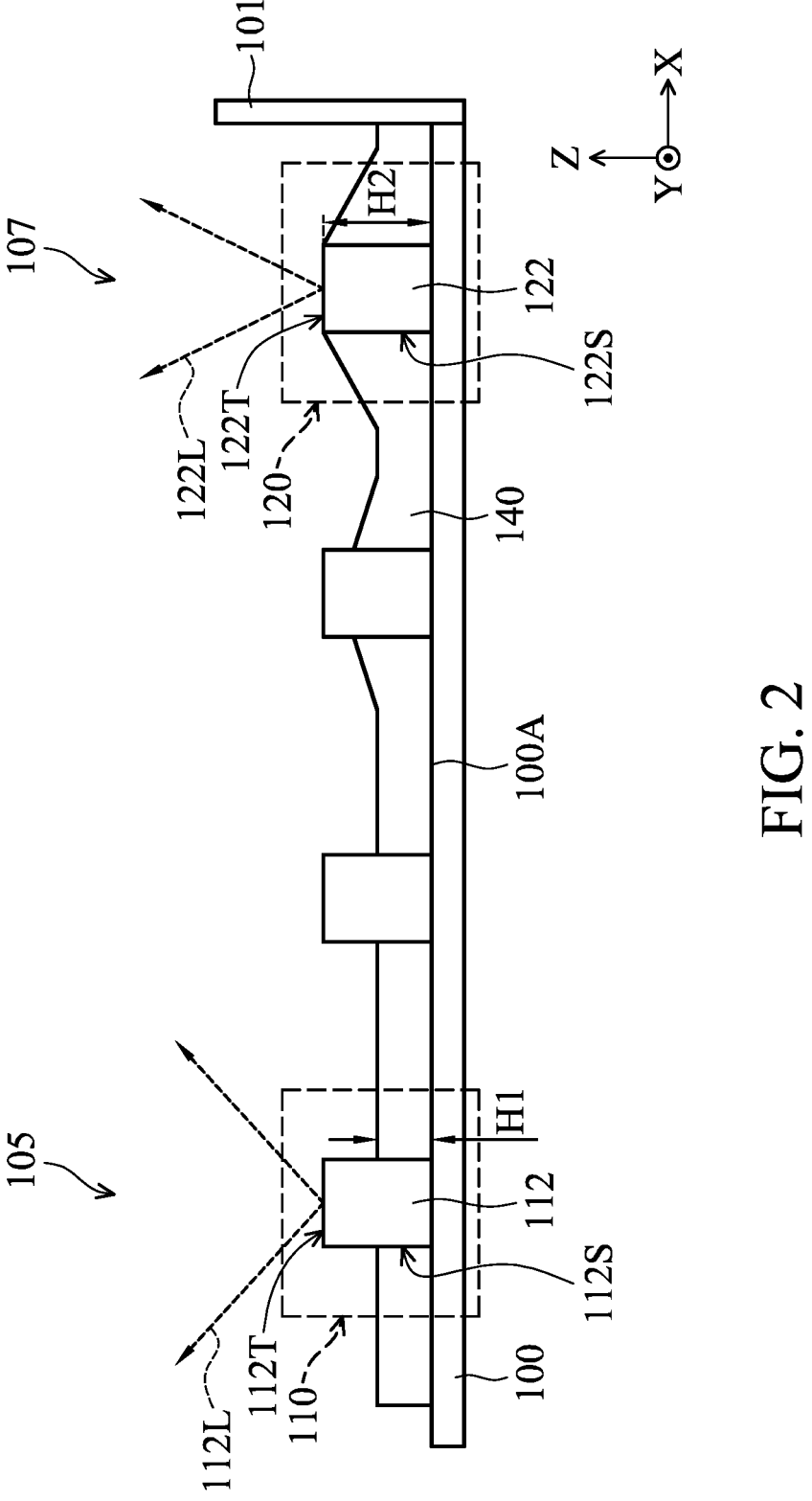
FIG. 2 shows a cross-sectional view of the electronic device in accordance with some embodiments of the present disclosure.

FIG. 2 shows a cross-sectional view of the electronic device 10 in accordance with some embodiments of the present disclosure. In the present embodiment, the first light-emitting assembly 110 located in the central region 105 may include at least one light-emitting element 112 that is disposed on the top surface 100A of the substrate 100 and a tuning element 140 surrounding the light-emitting element 112. In some embodiments, the light-emitting element 112 includes a top surface 112T and a plurality of sidewalls 112S that intersect with the top surface 112T, and the light-emitting element 112 can emit light from the top surface 112T and the sidewalls 112S. For example, the tuning element 140 includes a reflective material (such as white glue, silicone or any other reflective material that can be coated, but the present disclosure is not limited thereto). The tuning element 140 may cover at least a part of the sidewall 112S of the light-emitting element 112, the top surface 112T of the light-emitting element 112 is exposed.

In some embodiments, the tuning element 140 of the first light-emitting assembly 110 may have a first height H1, wherein the first height H1 is measured from the plane, where the tuning element 140 and the sidewalls 112S are intersected, in the normal direction (for example, the Z axis) of the top surface 100A of the substrate 100. As a result, the tuning element 140 can reflect part of the light emitted from the sidewalls 112S, so that the light may be concentrated in the normal direction of the top surface 112T of the light-emitting element 112, thereby improving the display efficiency of the electronic device 10. In the present embodiment, the type of light emitted by the light-emitting element 112 is defined as the first light-emitting pattern 112L, which will be described in detail below with reference to FIG. 3.

In addition, the second light-emitting assembly 120 located in the edge region 107 may include at least one light-emitting element 122 that is disposed on the top surface 100A of the substrate 100 and a tuning element 140 surrounding the light-emitting element 122. In some embodiments, the light-emitting element 122 includes a top surface 122T and a plurality of sidewalls 122S that intersect with the top surface 122T, and the light-emitting element 122 can emit light from the top surface 122T and the sidewalls 122S. The tuning element 140 may cover at least a part of the sidewall 122S of the light-emitting element 122, and the top surface 122T of the light-emitting element 122 is exposed.

In some embodiments, the tuning element 140 of the second light-emitting assembly 120 may have a second height H2, wherein the second height H2 is measured from the plane, where the tuning element 140 and the sidewalls 122S are intersected, in the normal direction (for example, the Z axis) of the top surface 100A of the substrate 100. In some embodiments, the first height H1 is less than the second height H2. In some embodiments, the second height H2 may be substantially equal to the height of the sidewalls 122S, that is, the tuning element 140 may completely cover the sidewalls 122S of the light-emitting element 122, but the present disclosure is not limited thereto. As a result, the tuning element 140 can reflect the light emitted from the sidewall 122S, so that the light can be further concentrated (compared to the light-emitting element 112) in the normal direction of the top surface 122T of the light-emitting element 122, thereby improving the brightness of the light emitted from the edge region 107, and reducing the phenomenon of uneven brightness in the edge region of the electronic device 10. In the present embodiment, the type of the light emitted by the light-emitting element 122 is defined as the second light-emitting pattern 122L, which will be described in detail below with reference to FIG. 3.

It should be noted that, in some embodiments, the distance between the light-emitting elements 110 in the central region 105 may be substantially equal to the distance between the light-emitting elements 120 in the edge region 107, but the present disclosure is not limited thereto. In other embodiments, the distance between the light-emitting elements 110 in the central region 105 may be greater than the distance between the light-emitting elements 120 in the edge region 107 (for example, as shown in FIG. 1, the distance S1 is greater than the distance S2).

Figure 3:
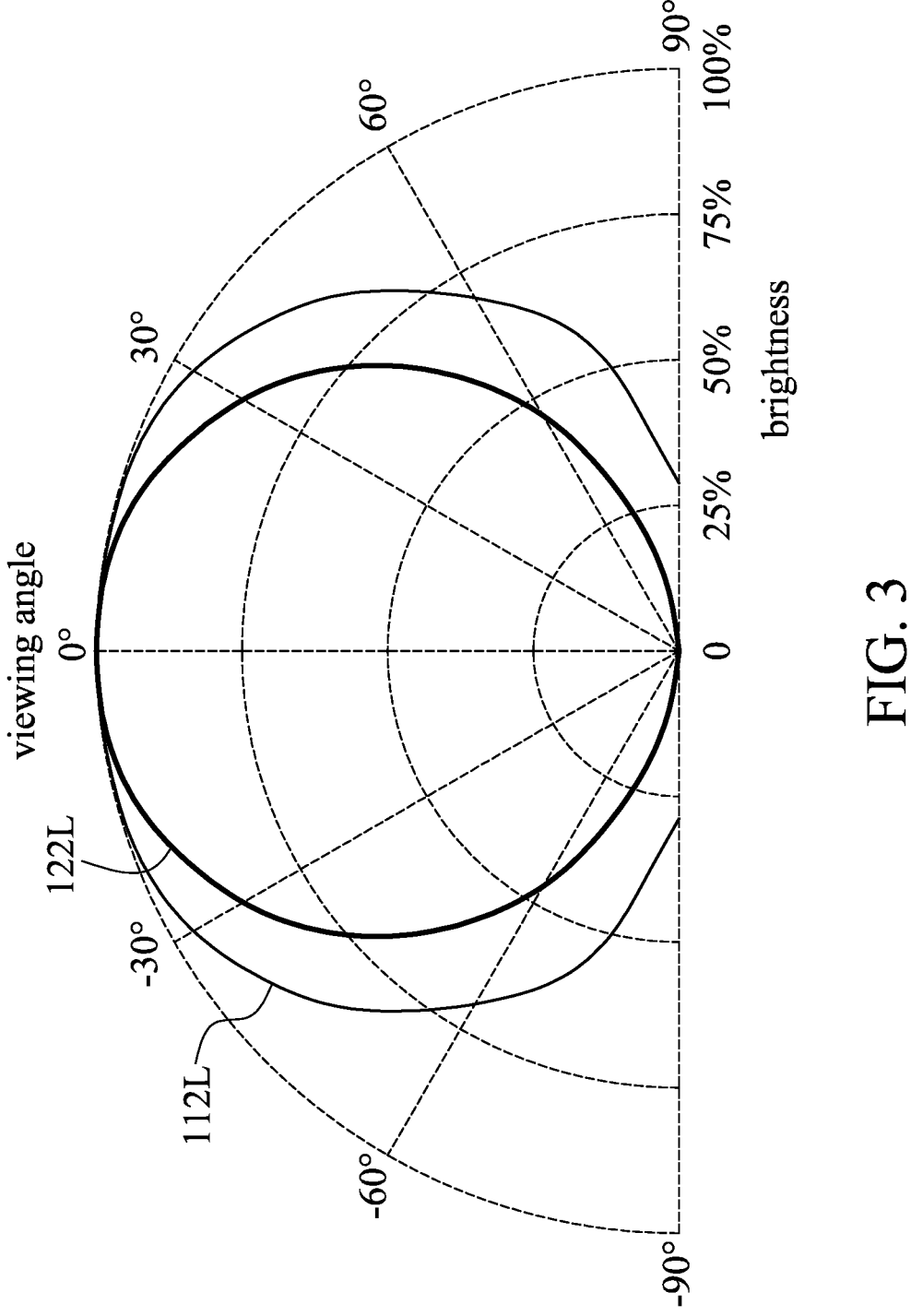
FIG. 3 shows a schematic diagram of a first light-emitting pattern and a second light-emitting pattern in accordance with some embodiments of the present/disclosure.

FIG. 3 shows a schematic diagram between the first light-emitting pattern 112L and the second light-emitting pattern 122L in accordance with some embodiments of the present disclosure. FIG. 3 shows the brightness of the light-emitting element 110 and the light-emitting element 120 that the user can observe under different viewing angles, wherein when the user is facing the substrate 100 straight on (that is, in the normal direction of the substrate 100) it is defined as a viewing angle of 0°, and when the user is parallel to the top surface 100A of the substrate 100 it is defined as a viewing angle of ±90°. In this embodiment, the positive and negative values of the viewing angles are merely used to represent directionality. In addition, the brightness of the light-emitting element 110 and the light-emitting element 120 observed by the user at a viewing angle of 0° is defined as 100%. The brightness results of the light-emitting element 110 and the light-emitting element 120 at different viewing angles are connected to define a first light-emitting pattern 112L and a second light-emitting pattern 122L, respectively. As shown in FIG. 3, at a viewing angle of 0°, the brightness of the first light-emitting pattern 112L is approximately the same as that of the second light-emitting pattern 122L.

In some embodiments, at a viewing angle of ±30°, a viewing angle of ±60°, and a viewing angle of ±90°, the brightness of the first light-emitting pattern 112L is higher than the brightness of the second light-emitting pattern 122L. As shown, the light emitted by the light-emitting element 110 is more dispersed than the light emitted by the light-emitting element 120. The light-emitting element 120 that emits more concentrated light is arranged in the edge region 107, and the light-emitting element 110 that emits scattered light is arranged in the central region 105, thereby reducing the phenomenon of uneven brightness in the electronic device 10, and improving the user's experiences using the electronic device 10.

Figure 4:
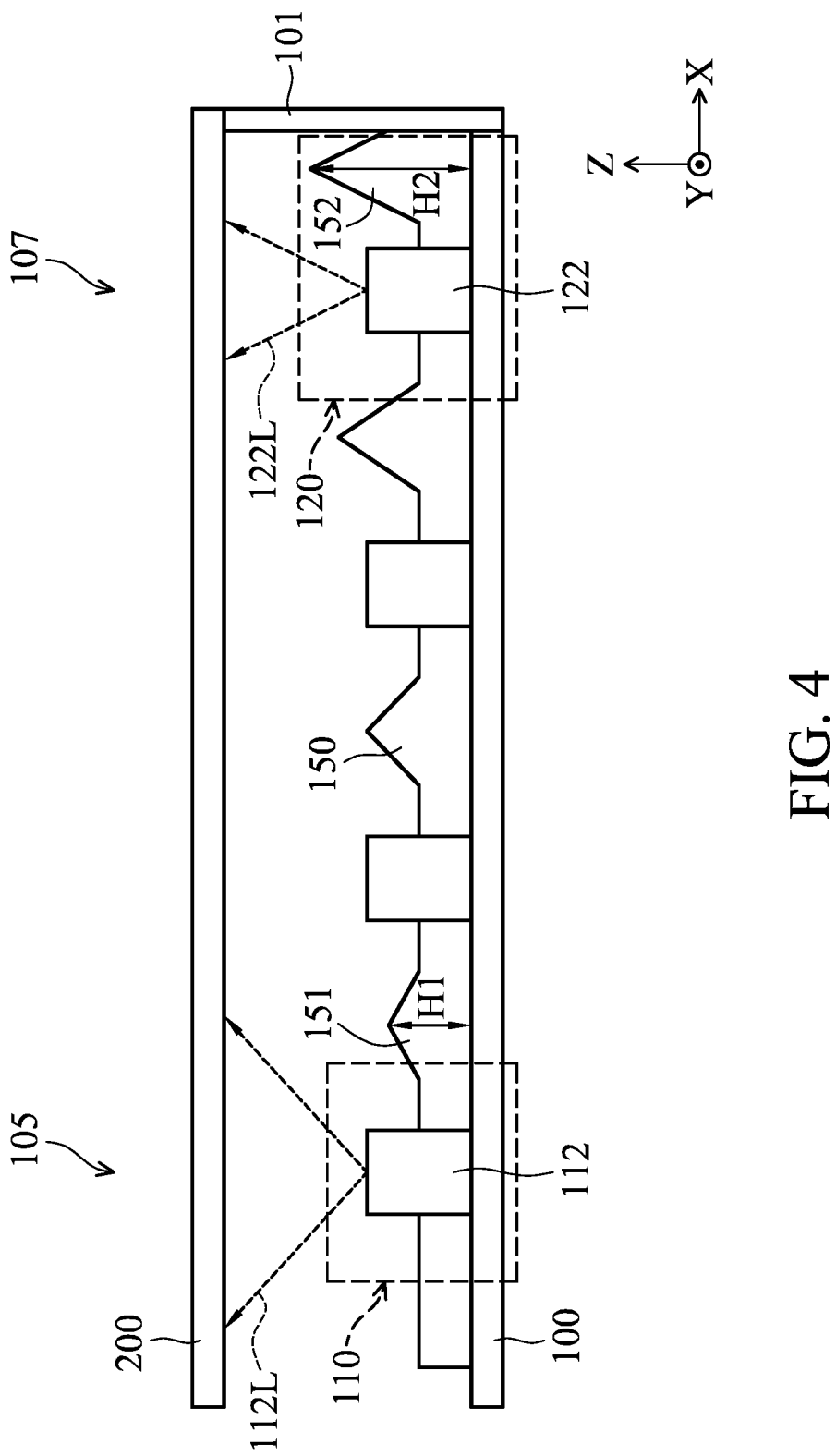
FIG. 4 shows a cross-sectional view of the electronic device in accordance with some embodiments of the present disclosure.

FIG. 4 shows a cross-sectional view of the electronic device 10 in accordance with some embodiments of the present disclosure. As shown in FIG. 4, the electronic device 10 may include a substrate 100 and a diffuser 200 facing each other. In some embodiments, the diffuser 200 may abut against the first edge 101 of the substrate 100, but the present disclosure is not limited thereto. In some embodiments, the first light-emitting assembly 110 located in the central region 105 may include at least one light-emitting element 112 that is disposed on the substrate 100, and a tuning element 150 surrounding the light-emitting element 112. The first light-emitting assembly 110 may have a first light-emitting pattern 112L. For example, the tuning element 150 includes a reflective material (such as white glue, silicone or any other reflective material that can be coated, but the present disclosure is not limited thereto). The tuning element 150 of the first light-emitting assembly 110 may form a spacer 151 around the light-emitting element 112, and the spacer 151 may have a first height H1, wherein the first height H1 is the shortest distance from the peak (which is away from the substrate 100) of the spacer 151 and the substrate 100. In some embodiments, the first height H1 is measured in the normal direction of the substrate 100 (for example, the Z axis). As a result, the tuning element 150 can reflect the light emitted from the light-emitting element 112, which is advantageous for focusing the light to the diffuser 200, thereby improving the display efficiency of the electronic device 10.

In addition, the second light-emitting assembly 120 located in the edge region 107 may include at least one light-emitting element 122 that is disposed on the substrate 100 and a tuning element 150 surrounding the light-emitting element 122. The second light-emitting assembly 120 may have a second light-emitting pattern 122L. The tuning element 150 of the second light-emitting assembly 120 may form a spacer 152 around the light-emitting element 122, and the spacer 152 may have a second height H2, wherein the second height H2 is the shortest distance from the peak (which is away from the substrate 100) of the spacer 152 and the substrate 100. In some embodiments, the second height H2 is measured in the normal direction of the substrate 100 (for example, the Z axis). In some embodiments, the first height H1 is less than the second height H2. In some embodiments, the second height H2 may be greater than the height of the sidewall of the light-emitting element 122, but the present disclosure is not limited thereto. As a result, the tuning element 150 can reflect the light emitted by the light-emitting element 122, so that the light is further concentrated (compared with the light-emitting element 112) in the normal direction of the substrate 100, thereby improving the brightness of the edge region 107. Accordingly, the phenomenon of uneven brightness in the edge region of the electronic device 10 is reduced.

It should be noted that although in this embodiment, a spacer (such as the spacer 151 or the spacer 152) of tuning element 150 is disposed between any two adjacent light-emitting elements (such as the light-emitting elements 112 or the light-emitting elements 122). That is, single light-emitting element is disposed between two adjacent spacers, but the present disclosure is not limited thereto. In some embodiments, a plurality of light-emitting elements may be disposed between any two adjacent spacers of the tuning element 150. That is, there may be no spacer of the tuning element 150 between any two adjacent light-emitting elements.

Figure 5:
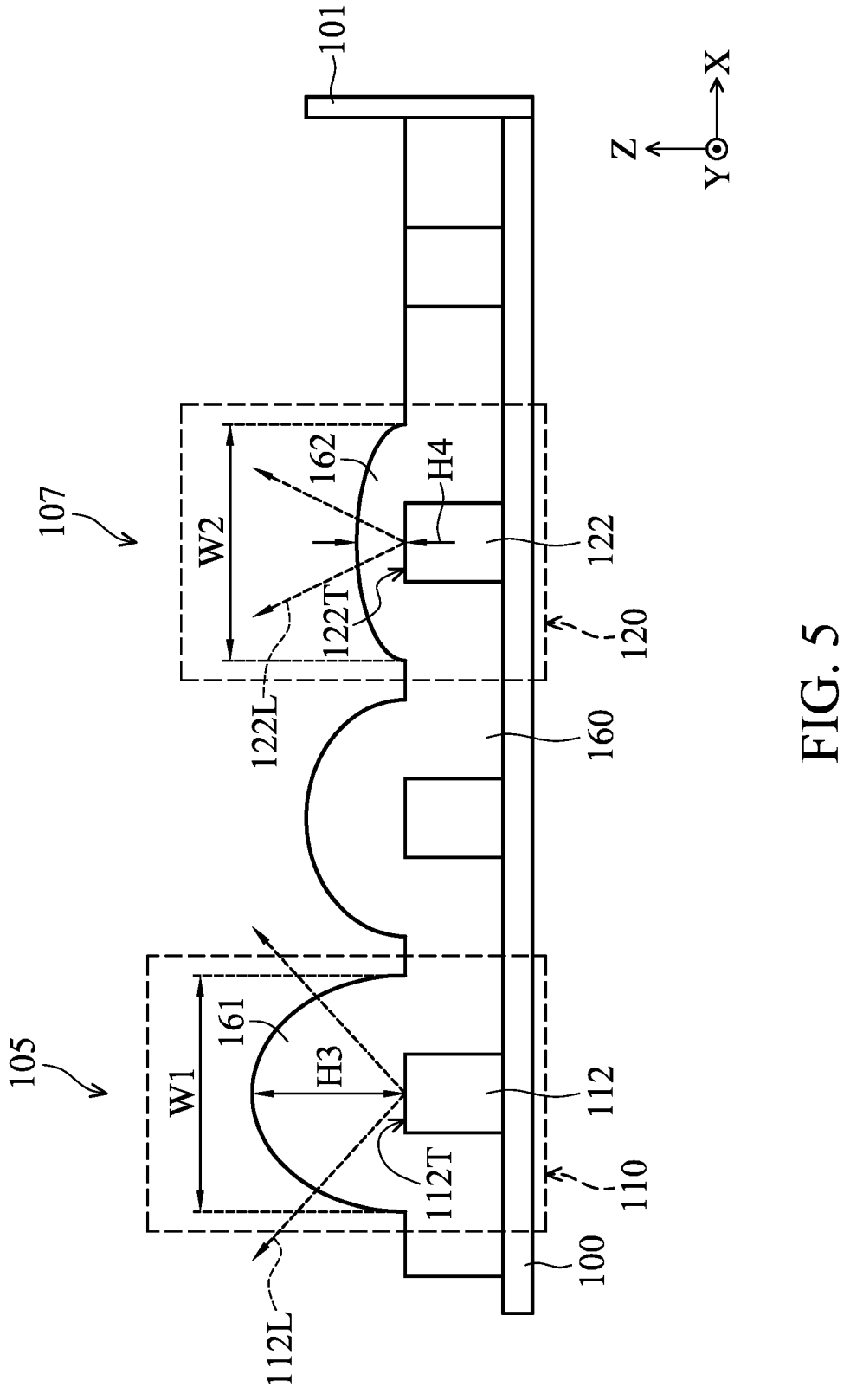
FIG. 5 shows a cross-sectional view of the electronic device in accordance with some embodiments of the present disclosure.

FIG. 5 shows a cross-sectional view of the electronic device 10 in accordance with some embodiments of the present disclosure. As shown in FIG. 5, the first light-emitting assembly 110 located in the central region 105 may include at least one light-emitting element 112 that is disposed on the substrate 100, and may also include a tuning element 160 covering the light-emitting element 112. The first light-emitting assembly 110 may have a first light-emitting pattern 112L. For example, the tuning element 160 includes a diffusion material (such as transparent resin, optical clear adhesive (OCA), acrylic adhesive, etc., but the present disclosure is not limited thereto). The tuning element 160 of the first light-emitting assembly 110 may include a light guide portion 161 that is located above and covers the top surface of the light-emitting element 112, and the light guide portion 161 may have a third height H3 and a first width W1. The third height H3 is the shortest distance between the peak (which is away from the light-emitting element 112) of the light guide portion 161 and the light-emitting element 112, and the first width W1 is the width of the light guide portion 161 on a plane level with the top surface of the light-emitting element 112. In some embodiments, the third height H3 is measured in the normal direction (such as the Z axis) of the substrate 100, and the first width W1 is measured in a direction (such as the X axis) that is parallel to the top surface of the substrate 100. In some embodiments, the ratio of the third height H3 to the first width W1 may be less than or equal to ½ (the third height H3/the first width W1≤½), but the present disclosure is not limited thereto. As a result, the tuning element 160 may guide the light emitted by the light-emitting element 112 to the diffuser 200, thereby improving the display efficiency of the electronic device 10.

In addition, the second light-emitting assembly 120 located in the edge region 107 may include at least one light-emitting element 122 that is disposed on the substrate 100 and may also include a tuning element 160 covering the light-emitting element 122. The second light-emitting assembly 120 can have a second light-emitting pattern 122L. The tuning element 160 of the second light-emitting assembly 120 may include a light guide portion 162 that is located above and covers the top surface of the light-emitting element 122, and the light guide portion 162 may have a fourth height H4 and a second width W2. The fourth height H4 is the shortest distance between the peak (which is away from the light-emitting element 122) of the light guide portion 162 and the light-emitting element 122, and the second width W2 is the width of the light guide portion 162 on a plane level with the top surface of the light-emitting element 122. In some embodiments, the fourth height H4 is measured in the normal direction (such as the Z axis) of the substrate 100, and the second width W2 is measured in a direction (such as the X axis) that is parallel to the top surface of the substrate 100.

In some embodiments, the third height H3 may be greater than the fourth height H4, and the first width W1 may be substantially equal to the second width W2. In some embodiments, the ratio of the fourth height H4 to the second width W2 may be less than or equal to ½ (the fourth height H4/the second width W2≤½), but the present disclosure is not limited thereto. As a result, the tuning element 160 may make the light emitted by the light-emitting element 122 more concentrated than the light emitted by the light-emitting element 112, thereby increasing the brightness of the light emitted by the edge region 107, and reducing the phenomenon of uneven brightness occurred in the electronic device 10.

Figure 6:
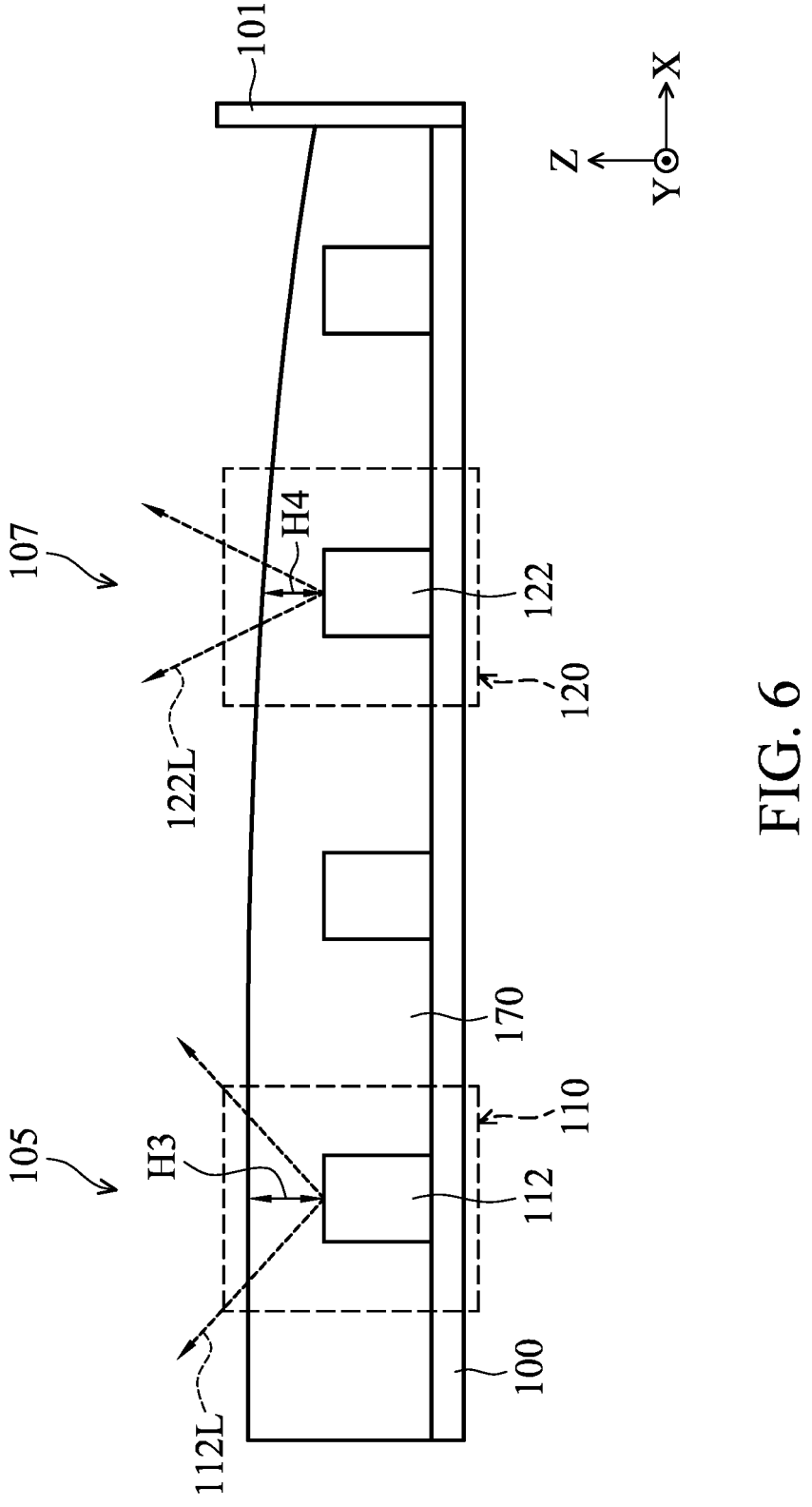
FIG. 6 shows a cross-sectional view of the electronic device in accordance with some embodiments of the present disclosure.

FIG. 6 shows a cross-sectional view of the electronic device 10 in accordance with some embodiments of the present disclosure. As shown in FIG. 6, the first light-emitting assembly 110 located in the central region 105 may include at least one light-emitting element 112 that is disposed on the substrate 100 and may also include a tuning element 170 covering the light-emitting element 112. The first light-emitting assembly 110 may have a first light-emitting pattern 112L. For example, the tuning element 170 includes a diffusion material (such as transparent resin, optical clear adhesive (OCA), acrylic adhesive, etc., but the present disclosure is not limited thereto). The tuning element 170 of the first light-emitting assembly 110 may have a third height H3, wherein the third height H3 is a linear distance between the center of the top surface of the light-emitting element 112 and the upper edge of the tuning element 170 directly above the light-emitting element 112. In some embodiments, the third height H3 is measured in the normal direction (such as the Z axis) of the substrate 100. As a result, the tuning element 170 may guide the light emitted by the light-emitting element 112 to the diffuser 200, thereby improving the display efficiency of the electronic device 10.

In addition, the second light-emitting assembly 120 located at the edge region 107 may include at least one light-emitting element 122 that is disposed on the substrate 100, and may also include a tuning element 170 covering the light-emitting element 122. The second light-emitting assembly 120 may have a second light-emitting pattern 122L. The tuning element 170 of the second light-emitting assembly 120 may have a fourth height H4, wherein the fourth height H4 is a linear distance between the center of the top surface of the light-emitting element 122 and the upper edge of the tuning element 170 directly above the light-emitting element 122. In some embodiments, the fourth height H4 is measured in the normal direction (for example, the Z axis) of the substrate 100. In some embodiments, the third height H3 may be greater than the fourth height H4.

Accordingly, the tuning element 170 can make the light emitted by the light-emitting element 122 more concentrated than the light emitted by the light-emitting element 112, thereby increasing the brightness of the light emitted by the edge region 107, and reducing the phenomenon of uneven brightness occurred in the electronic device 10. In some embodiments, the height of the tuning element 170 gradually decreases from the first light-emitting assembly 110 to the second light-emitting assembly 120, but the present disclosure is not limited thereto. In some embodiments, any configuration is acceptable as long as the third height H3 of the tuning element 170 is greater than the fourth height H4 of the tuning element 170.

Figure 7:
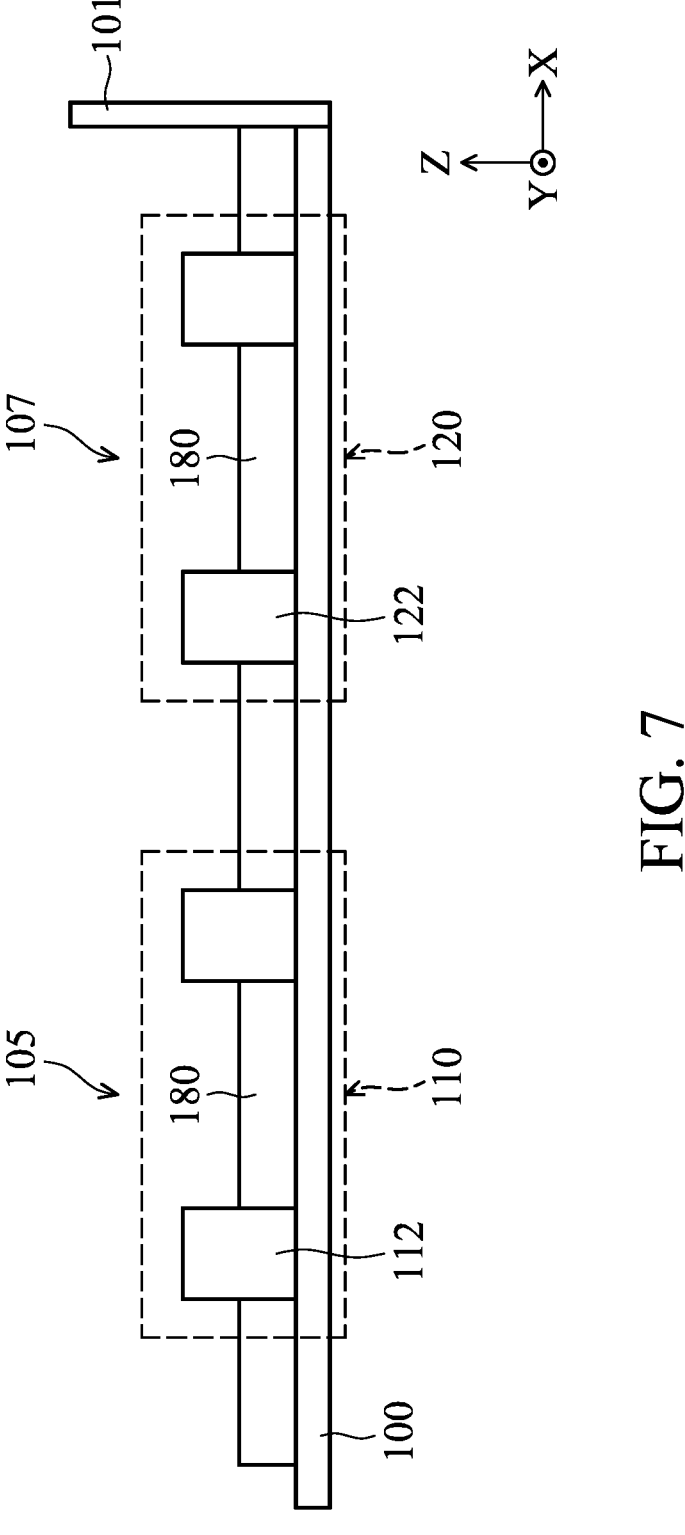
FIG. 7 shows a cross-sectional view of the electronic device in accordance with some embodiments of the present disclosure.

FIG. 7 shows a cross-sectional view of the electronic device 10 in accordance with some embodiments of the present disclosure. As shown in FIG. 7, the first light-emitting assembly 110 located in the central region 105 may include at least one light-emitting element 112 disposed on the substrate 100, and may also include a tuning element 180 surrounding the light-emitting element 112. For example, the tuning element 180 includes any suitable reflective material, but the present disclosure is not limited thereto. In some embodiments, the second light-emitting assembly 120 located in the edge region 107 may include at least one light-emitting element 122 that is disposed on the substrate 100, and may also include a tuning element 180 surrounding the light-emitting element 122. In some embodiments, the height of the tuning element 180 of the first lighting assembly 110 is approximately the same as the height of the tuning element 180 of the second lighting assembly 120.

In some embodiments, the light-emitting element 112 of the first light-emitting assembly 110 may emit light on four sides (for example, emit light from the sidewalls of the light-emitting element 112) or include a lens (not shown), and the light-emitting element 122 of the second light-emitting assembly 120 may emit light on single side (for example, emit light from the top surface of the light-emitting element 122) or on five sides (for example, emit light from the top surface and sidewalls of the light-emitting element 122). As a result, the light emitted by the light-emitting element 110 is more dispersed than the light emitted by the light-emitting element 120. The light-emitting element 120 that emits more concentrated light is disposed in the edge region 107, and the light-emitting element 110 that emits scattered light is disposed in the central region 105, thereby reducing the phenomenon of uneven brightness occurred in the electronic device 10, and improving the user's experiences using the electronic device 10.

It should be understood that in the above embodiments, the central region 105 and the edge region 107 serve as examples to illustrate the configuration of the electronic device 10, and those skilled in the art should be able to know the configuration relationship among the central region 105, the edge region 107, and the corner region 109 based on the above embodiments, and therefore will not be described in detail below. In addition, although the above-mentioned embodiments merely show the configuration of the substrate, the light-emitting element and/or the diffuser, those skilled in the art should be able to dispose other optical layers and/or optical elements in the structure described herein for the purpose of enhancing the display effect based on the present disclosure. These configurations derived from the present disclosure are also included in the scope of the present disclosure.

In summary, the embodiments of the present disclosure provide an electronic device including light-emitting assemblies having different light-emitting patterns. By arranging the light-emitting elements in different regions at different pitches, or disposing the tuning elements around the light-emitting elements in different ways, the light-emitting pattern of the light-emitting assemblies located in the edge region or corner region may be more concentrated than that of the light-emitting assemblies in the center region, so that the phenomenon of uneven brightness in the electronic device may be reduced, thereby improving the user's experience of using the electronic device.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An electronic device, comprising:
a substrate, comprising:
  a first edge;
  an edge region adjacent to the first edge; and
  a central region adjacent to the edge region and away from the first edge;
a plurality of light-emitting assemblies disposed on the substrate, wherein each of the light-emitting assemblies has a tuning element and a light-emitting element, and the light-emitting assemblies further comprise:
  a first light-emitting assembly disposed in the central region and having a first light-emitting pattern; and a second light-emitting assembly disposed in the edge region and having a second light-emitting pattern, wherein at a viewing angle of 60°, a brightness of the first light-emitting pattern is higher than a brightness of the second light-emitting pattern; and a diffuser over the substrate, wherein the diffuser covers the light-emitting assemblies and abuts against the first edge of the substrate.

2. The electronic device as claimed in claim 1, wherein the tuning element surrounds the light-emitting element, the tuning element of the first light-emitting assembly has a first height, the tuning element of the second light-emitting assembly has a second height, and the first height is less than the second height.

3. The electronic device as claimed in claim 2, wherein the tuning element comprises a reflective material.

4. The electronic device as claimed in claim 2, wherein the tuning element comprises a spacer between the light-emitting elements.

5. The electronic device as claimed in claim 4, wherein the spacer is lower than a top surface of the light-emitting element of the first light-emitting assembly.

6. The electronic device as claimed in claim 4, wherein the spacer is higher than a top surface of the light-emitting element of the second light-emitting assembly.

7. The electronic device as claimed in claim 1, wherein the tuning element covers the light-emitting element, the tuning element of the first light-emitting assembly has a third height, the tuning element of the second light-emitting assembly has a fourth height, and the third height is greater than the fourth height.

8. The electronic device as claimed in claim 7, wherein the tuning element comprises a diffusive material.

9. The electronic device as claimed in claim 7, wherein the height of the tuning element is gradually decreased from the first light-emitting assembly to the second light-emitting assembly.

10. The electronic device as claimed in claim 7, wherein the tuning element comprises a light guide portion over the light-emitting element, and the light guide portion has a curved profile in a cross-sectional view.

11. The electronic device as claimed in claim 7, wherein each of the tuning elements of the light-emitting assemblies are separate from each other.

12. The electronic device as claimed in claim 7, wherein a ratio of the third height to a width of the light-emitting element is less than or equal to ½.

13. The electronic device as claimed in claim 7, wherein a ratio of the fourth height to a width of the light-emitting element is less than or equal to ½.

14. An electronic device, comprising:

a substrate, comprising:

a first edge;

an edge region adjacent to the first edge; and a central region adjacent to the edge region and away from the first edge; and a plurality of light-emitting assemblies disposed on the substrate, wherein each of the light-emitting assemblies has a tuning element and a light-emitting element, and the light-emitting assemblies further comprise:

a first light-emitting assembly disposed in the central region and having a first light-emitting pattern, wherein the first light-emitting assembly comprises a first light-emitting element; and a second light-emitting assembly disposed in the edge region and having a second light-emitting pattern, wherein the second light-emitting assembly comprises a second light-emitting element, the second light-emitting element emits light from single surface or five surfaces, and the first light-emitting element emits light from four surfaces, wherein at a viewing angle of 60°, a brightness of the first light-emitting pattern is higher than a brightness of the second light-emitting pattern.

15. The electronic device as claimed in claim 1, wherein the first light-emitting assembly comprises a first light-emitting element, the second light-emitting assembly comprises a second light-emitting element, the second light-emitting element emits light from single surface or five surfaces, and the first light-emitting element comprises a lens.

16. An electronic device, comprising:

a substrate, comprising:

a first edge;

an edge region adjacent to the first edge; and a central region adjacent to the edge region and away from the first edge; and a plurality of light-emitting assemblies disposed on the substrate, wherein each of the light-emitting assemblies has a tuning element and a light-emitting element, and the light-emitting assemblies further comprise:

a first light-emitting assembly disposed in the central region and having a first light-emitting pattern; and a second light-emitting assembly disposed in the edge region and having a second light-emitting pattern, wherein the first light-emitting assembly and the second light-emitting assembly each comprise a plurality of light-emitting elements, and a distance between two adjacent light-emitting elements of the first light-emitting assembly is greater than a distance between two adjacent light-emitting elements of the second light-emitting assembly, wherein at a viewing angle of 60°, a brightness of the first light-emitting pattern is higher than a brightness of the second light-emitting pattern.

17. The electronic device as claimed in claim 16, wherein the substrate further comprises:

a second edge intersecting with the first edge; and a corner region adjacent to the first edge and the second edge, wherein the light-emitting assemblies further comprise a third light-emitting assembly disposed at the corner region, the third light-emitting assembly comprises a plurality of light-emitting elements, and the distance between two adjacent light-emitting elements of the second light-emitting assembly is greater than a distance between two adjacent light-emitting elements of the third light-emitting assembly.

18. The electronic device as claimed in claim 1, wherein at a viewing angle of 30°, the brightness of the first light-emitting pattern is higher than the brightness of the second light-emitting pattern.

* * * * *